United States Patent
Vyvoda et al.

(10) Patent No.: US 7,245,000 B2
(45) Date of Patent: Jul. 17, 2007

(54) ELECTRICALLY ISOLATED PILLARS IN ACTIVE DEVICES

(75) Inventors: Michael A. Vyvoda, San Jose, CA (US); Manish Bhatia, Sunnyvale, CA (US); James M. Cleeves, Redwood City, CA (US); N. Johan Knall, Sunnyvale, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 10/681,504

(22) Filed: Oct. 7, 2003

(65) Prior Publication Data

US 2004/0087072 A1    May 6, 2004

Related U.S. Application Data

(63) Continuation of application No. 10/185,507, filed on Jun. 27, 2002, now Pat. No. 6,952,043.

(51) Int. Cl.
*H01L 27/103* (2006.01)

(52) U.S. Cl. ...................... 257/530; 365/103

(58) Field of Classification Search ............. 257/208, 257/209, 211, 278, 528–530; 365/51, 54, 365/63, 72, 100, 103, 175, 225.7, 242
See application file for complete search history.

(56) References Cited

U.S. PATENT DOCUMENTS

| | | | |
|---|---|---|---|
| 5,693,556 A | 12/1997 | Cleeves | |
| 5,835,396 A | 11/1998 | Zhang | |
| 5,882,997 A | 3/1999 | Sur, Jr. et al. | |
| 5,970,372 A | 10/1999 | Hart et al. | |
| 6,004,874 A | 12/1999 | Cleeves | |
| 6,034,882 A | 3/2000 | Johnson et al. | |
| 6,185,122 B1 | 2/2001 | Johnson et al. | |
| 6,351,406 B1 | 2/2002 | Johnson et al. | |
| 6,420,215 B1 | 7/2002 | Knall et al. | |
| 6,483,736 B2 | 11/2002 | Johnson et al. | |
| 6,525,953 B1 | 2/2003 | Johnson | |
| 6,559,516 B1 | 5/2003 | VanBrocklin et al. | |
| 6,627,530 B2 | 9/2003 | Li et al. | |
| 6,642,603 B1 | 11/2003 | Knall | |
| 6,717,222 B2 | 4/2004 | Zhang | |
| 6,780,711 B2 | 8/2004 | Johnson et al. | |
| 6,812,488 B2 | 11/2004 | Zhang | |
| 2002/0018355 A1* | 2/2002 | Johnson et al. ............. | 365/103 |
| 2003/0003681 A1* | 1/2003 | Xu et al. .................... | 438/424 |
| 2003/0025210 A1 | 2/2003 | Li et al. | |
| 2003/0081446 A1 | 5/2003 | Fricke et al. | |

* cited by examiner

*Primary Examiner*—Thomas L. Dickey
(74) *Attorney, Agent, or Firm*—Welsh & Katz, Ltd.

(57) ABSTRACT

A monolithic three dimensional memory array is described. The memory array comprises a first set of strips including a first terminal; a second set of strips including a second terminal; a third set of strips including a third terminal; a first pillar having at least one side wall with a slightly positive slope, said pillar disposed between and connecting said first and second sets of strips, and including a first P doped silicon region, a first N doped silicon region and a first insulating region; a second pillar having at least one side wall with a slightly positive slope, said pillar disposed between and connecting said second and third sets of strips, and including a second P doped silicon region, a second N doped silicon region and a second insulating region; wherein each of the pillars is substantially free of stringers.

3 Claims, 14 Drawing Sheets

ELECTRICALLY ISOLATED PILLARS IN ACTIVE DEVICES

The present patent application is a Continuation of application Ser. No. 10/185,507, filed Jun. 27, 2002 now U.S. Pat. No. 6,952,043.

BACKGROUND OF THE INVENTION

1. Field of the Invention

The invention relates to a new way of making electrically isolated pillars in silicon active devices. It has particular application to three-dimensional (3D) memories, and in particular to 3D memories that include diodes or incipient diodes (i.e., two halves of a diode separated by an antifuse layer).

2. Discussion of the Related Art 3D memories can be much lower cost than conventional 2D memories. If a conventional memory occupies X square millimeters of silicon area, then a 3D memory comprising N planes of bits occupies approximately (X/N) square millimeters of silicon area. Reduced area means that more finished memory devices can be built on a single wafer, thereby reducing cost. Thus, there is a strong incentive to pursue 3D memories having multiple planes of memory cells.

U.S. Pat. No. 6,034,882, assigned to Matrix Semiconductor, Inc. and incorporated by reference herein, describes a 3D field-programmable, non-volatile memory that is well suited to extremely small memory cells. Each memory cell includes a pillar of layers formed at the intersection between upper and lower conductors. In one embodiment, the pillar includes a steering element, such as a diode, that is connected in series with a state change element, such as an antifuse layer. In the preferred embodiment described therein, each pillar is isolated from neighboring pillars by a pair of self-aligned etch steps and interleaved dielectric depositions. When the antifuse layer is intact (i.e., the cell is not programmed), the cell is electrically an open circuit. When the antifuse layer is breached (i.e., the cell is programmed), the cell is electrically a diode in series with the resistance of the breached antifuse layer.

U.S. patent application Ser. No. 09/560,626 filed Apr. 28, 2000 and its continuation-in-part application Ser. No. 09/814,727 filed Mar. 21, 2001, both entitled, "Three-Dimensional Memory Array and Method of Fabrication, assigned to Matrix Semiconductor, Inc. and incorporated by reference herein, disclose, rather than pillars, a memory cell at intersections of rail stacks. The memory cell includes a combined steering element and state change element. Specifically, the disclosed memory cell includes an antifuse layer disposed between the anode and the cathode of an incipient diode. When the antifuse layer is intact, the cell is electrically an open circuit. But when the antifuse is breached, a portion of the anode material and a portion of the cathode material are fused in a small-diameter filament, thereby forming the diode.

U.S. patent application Ser. No. 09/928,536, filed Aug. 13, 2001, entitled "Vertically-Stacked, Field Programmable, Nonvolatile Memory and Method of Fabrication," assigned to Matrix Semiconductor, Inc. and incorporated by reference herein, describes 3D memories having various pillar configurations and including antifuse and diode components.

U.S. patent application Ser. No. 09/639,577 filed Aug. 14, 2000, entitled, "Multigate Semiconductor Device with Vertical Channel Current and Method of Fabrication" assigned to Matrix Semiconductor, Inc. and incorporated by reference herein, describes 2D memories having various pillar configurations and including transistor components.

U.S. patent application Ser. No. 09/927,648 filed Aug. 13, 2001, entitled, "Dense Arrays and Charge Storage Devices, and Methods for Making Same," assigned to Matrix Semiconductor, Inc. and incorporated by reference herein, describes 3D memories having various pillar configurations and including diode or transistor components.

When pillar structures are formed, a typical procedure would be to etch a first plurality of layers into strips in a first direction, fill the spaces in between the strips with a dielectric, deposit a second plurality of layers, and then etch both second and first plurality of layers in a second direction, orthogonal to the first. The second etch is selective to material constituting the first and second plurality of layers, and does not appreciably etch the dielectric. Accordingly, as explained in more detail below, any material within the first plurality of layers, trapped under the dielectric that is laid down after the first etch, will not be removed in the second etch. This remaining material, sometimes called a "stringer," can provide an unintended electrical path between adjacent pillars.

Where two adjacent pillars have stringers that interfere with their electrical isolation from each other, the functioning of these memory cells can be compromised. Specifically, a write operation to one memory cell can undesirably affect one or both memory cells, i.e., a write disturb condition can occur.

Previously, stringer formation could be prevented in at least two ways: (i) by using an "aggressive," perfectly vertical anisotropic etch, such as pure $Cl_2$ in the case of a silicon-containing first plurality of layers, so that no dielectric (e.g., $SiO_2$) hardmask overhang forms over a sloped sidewall of the first plurality of layers, and therefore no material from the first plurality of layers is trapped under the dielectric to form a stringer in the first place, or (ii) by using a "less aggressive etch," i.e., an etch that results in a positive slope that causes stringers (due to the overhanging $SiO_2$ hardmask), but following that etch by an isoptropic etch that clears away the stringer (dilute $SF_6$ in a noble gas such as Ar, for example) after the stringers are formed. The distinction between these two approaches is that the former prevents stringers from forming, but the latter "cleans" them up after they've formed.

Nevertheless, both approaches have drawbacks. The use of etchants, such as $Cl_2$, that typically produce quite vertical sidewalls is problematic because such etchants are so "aggressive" that they isotropically (i.e., multi-directionally) etch the refractory metal silicide conductors that are used in the devices (such as $TiSi_2$), even though they very anisotropically (uni-directionally, e.g., vertically) etch Si. This aggressive etching is undesirable as it can cause such conductors to function unreliably. On the other hand, using a "stringer-clearing" second etch is problematic because it is very difficult to control and can etch the pillar as well as the stringer.

Therefore, a need arises for a method of accurately forming active devices, such as diodes, that is compatible with less aggressive etch chemistries.

SUMMARY OF THE INVENTION

In accordance with one aspect of the invention, a method of forming an active device is provided. The method includes performing a first patterning operation on a first plurality of layers. This first patterning operation defines a first feature of the active device. Then, a second patterning operation can be performed on at least one layer of the first plurality of layers. This second patterning operation defines a second feature of the active device. Of importance, the first and second patterning operations are performed substantially back-to-back, i.e., without the interposition of a dielectric fill step, thereby ensuring that the active device can accurately function. Note that other processing steps can be carried out, such as but not limited to sidewall oxidations, sidewall cleaning operations such as solvent dips, and anneals such as furnace anneals or rapid thermal anneals (RTAs), without changing the "back-to-back" nature of the process. This back-to-back patterning avoids the situation described in the background where the dielectric could protect a portion of the strips from a subsequent etch, thereby resulting in electrically problematic stringer formation.

In accordance with another aspect of the invention, a method is provided for forming a pillar from a plurality of layers formed on a wafer. The method comprises performing substantially back-to-back patterning steps. Specifically, a first patterning step etches the plurality of layers in a first direction to form a plurality of strips. A second patterning step etches the plurality of strips in a second direction, wherein the first direction is different from the second direction.

Preferred embodiments are directed to the application of this invention to memory devices, and particularly to 3-D memory devices built above a substrate. The memory devices can, for example, have diodes or transistors as active components, such as (but not limited to) those described in the patents and applications discussed in the Background section above.

It should be noted that this invention has applicability to active devices (i.e., transistors, diodes, and the like) that are not necessarily part of memory arrays. For example, the invention provides a pillar-forming process, free of stringers, which could be used whenever one is building active devices that require pillars that do not electrically interfere with each other. A general condition in which electrical interference could be a problem, due to stringers, would be a case in which the combination of device materials and processing restrictions (possibly due to the choice of device materials, but not necessarily) cause a positive slope during etches. That is, line/space patterning in a first direction, yielding features with sidewalls having a positive slope, followed by line/space fill deposition, followed by patterning in a second direction, would result in pillars connected by stringers.

The preferred embodiment describes the formation of one kind of antifuse-programmable diode memory, but the invention also applies, for instance, to arrays of thin film transistors (TFTs) that need electrical isolation in order to avoid disturb phenomena, other varieties of antifuse-programmable diode memory, and other kinds of memory and logic devices.

DETAILED DESCRIPTION OF THE DRAWINGS

According to a first aspect of the invention, at least one portion of an active device is made by performing sequential patterning steps in a "back-to-back" fashion, i.e, without the interposition of a dielectric fill step between the patterning steps. Note that other processing steps can be carried out, such as but not limited to sidewall oxidations, sidewall cleaning operations such as solvent dips, and anneals (such as furnace anneals or RTAs) without changing the "back-to-back" nature of the process described herein.

In one embodiment, a first patterning operation includes etching a plurality of layers into a plurality of strips, thereby forming rails oriented in a first direction. A second patterning operation includes etching at least one strip of the first plurality of strips in a second direction, wherein the second direction is typically orthogonal to the first direction. The first and second etches form pillars, which include portions of the active devices. In accordance with one preferred embodiment of the invention, a 3D memory cell is fabricated with certain patterning steps performed back-to-back, thereby preventing the formation of residual matter in between the pillars that can adversely affect memory functionality.

For clarification of various aspects, features, and advantages of the invention, a brief description of a 3D memory cell, exemplary pillar configurations, and fabrication sequence follows.

Figure 1:
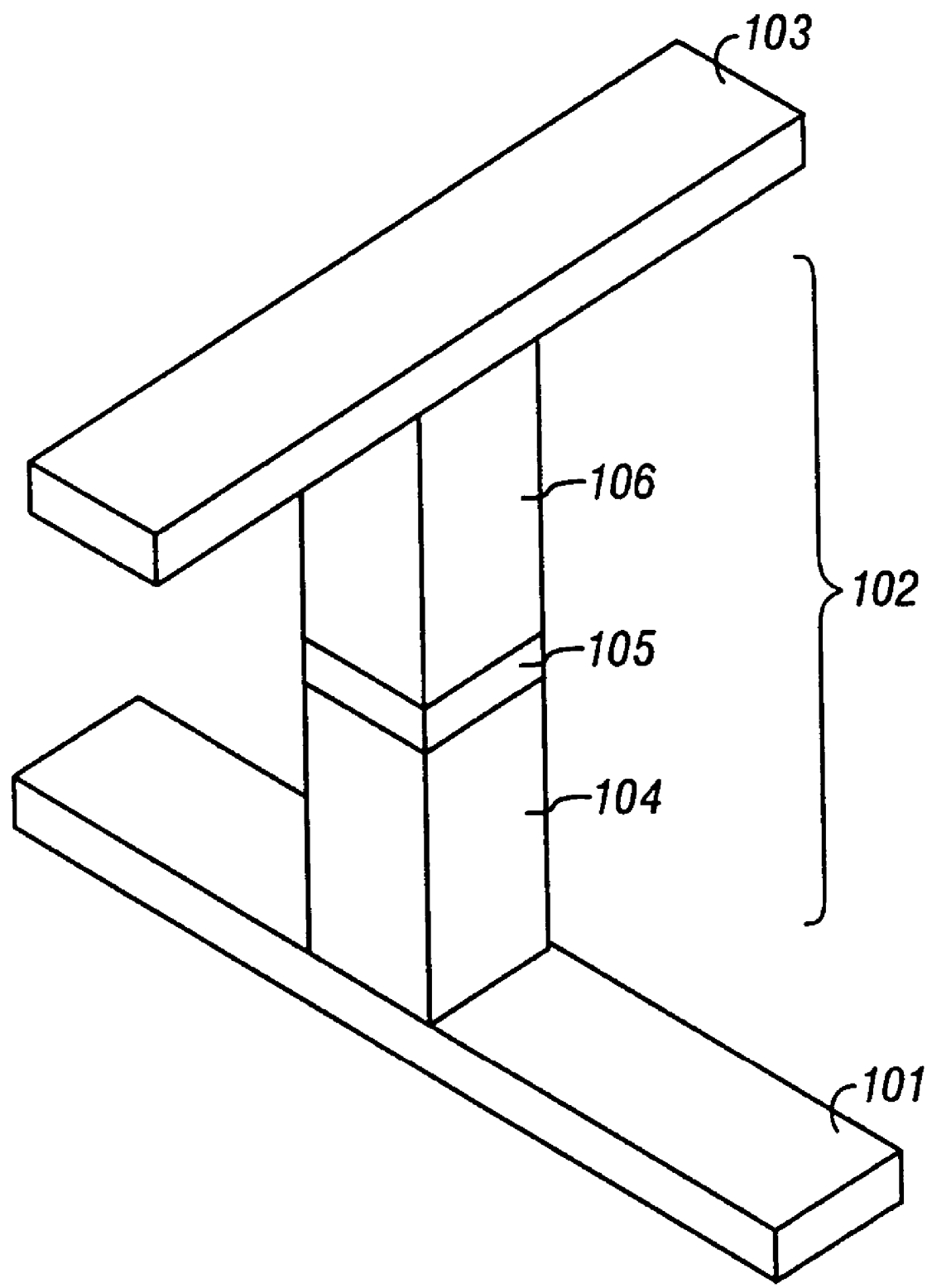
FIG. 1 is a perspective view of one embodiment of a 3D memory cell.

FIG. 1 shows one embodiment of a 3D memory cell in pillar form, having antifuse and diode components. Specifically, the 3D memory cell includes an input terminal 101, a pillar 102, and an output terminal 103. In this embodiment, pillar 102 includes a first diode component 104 and a second diode component 106 separated by an antifuse layer 105. Antifuse layer 105 can be chosen so that it can be switched from its initial state to another state by electrical means, thereby making the memory cell field programmable. For example, the state of an antifuse can be changed electrically by applying a relatively large voltage (when compared to the voltage used for reading) across input and output terminals 101, 103 of the memory cell.

FIGS. 2A–2D illustrate four exemplary pillar configurations. In each case, the pillars are shown between crossing conductors 210, 220, and 230. The memory cells are fabricated on a substrate 201 that may be a conventional silicon monocrystalline substrate. Alternately, substrate 201 may be a silicon-on-sapphire substrate, a dielectrically isolated substrate, or a silicon-on-insulator substrate. An insulating layer 202 is formed over substrate 201. Insulating layer 202 may be planarized with, for example, chemical mechanical polishing (CMP) to provide a flat surface on which the memory cells can be fabricated.

Conductors 210, 220, and 230, formed using any standard thin-film deposition process, can include elemental metals (such as tungsten, tantalum, aluminum, and copper), metal alloys (such as MoW), metal silicides (such as $TiSi_2$ or $CoSi_2$), or conductive compounds (such as TiN or WC). The layers adjacent to the conductors can be highly doped silicon layers (N+, P+), which can form part of the diode. Additionally, the N+ layer just below conductor 220 in FIG. 2C can be part of conductor 220, and the P+ layer just below conductor 230 can be part of conductor 230 (note that this can apply to any of FIGS. 2A–2D). Note that these highly doped silicon layers stop ohmic transitions, thereby preventing unintended Schottky diode formation. Only a single lightly doped layer (in conjunction with a heavily doped layer of another doping type) is needed to define a diode. The thickness of this lightly doped layer is important in controlling the breakdown voltage and resistance of the to-be-formed diode.

Figure 2D:
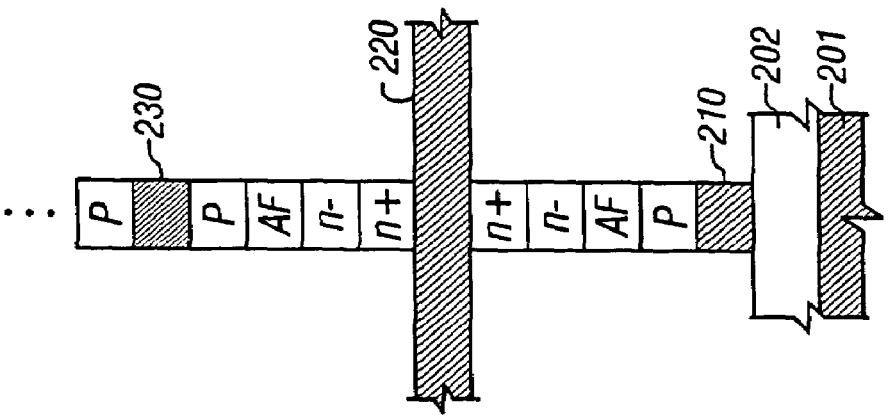
FIGS. 2A–2D are schematic views of alternative pillar materials and configurations that can be used in a 3D memory cell.
Figure 2C:
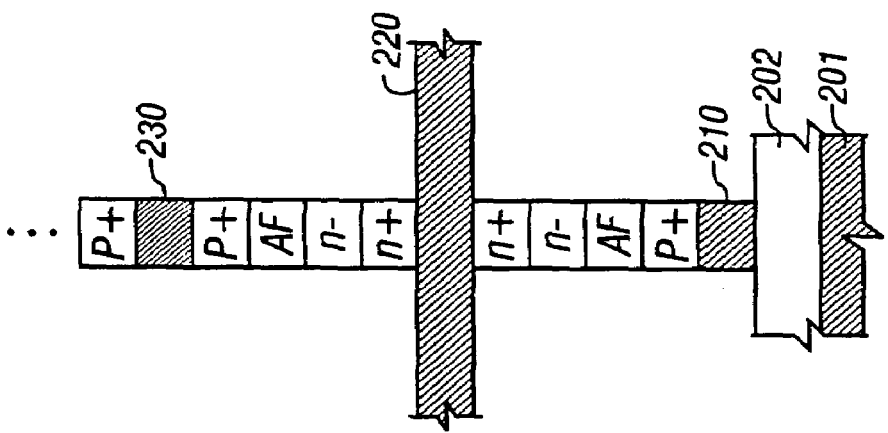
Figure 2B:
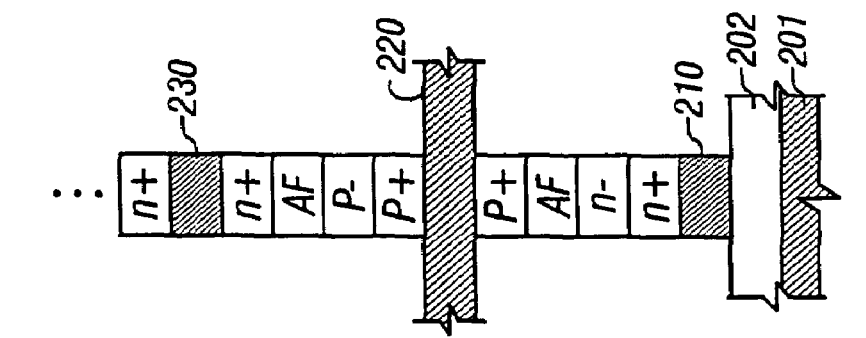
Figure 2A:
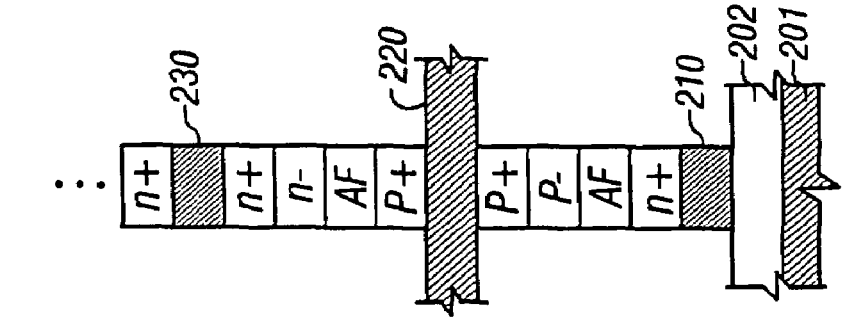

Note that the sequencing of the pillar layers determines the forward biasing of the diodes. For example, the diodes of FIGS. 2A and 2B are forward biased towards conductors 210 and 230. In contrast, the diodes of FIGS. 2C and 2D are forward biased towards conductor 220.

Figure 3A:
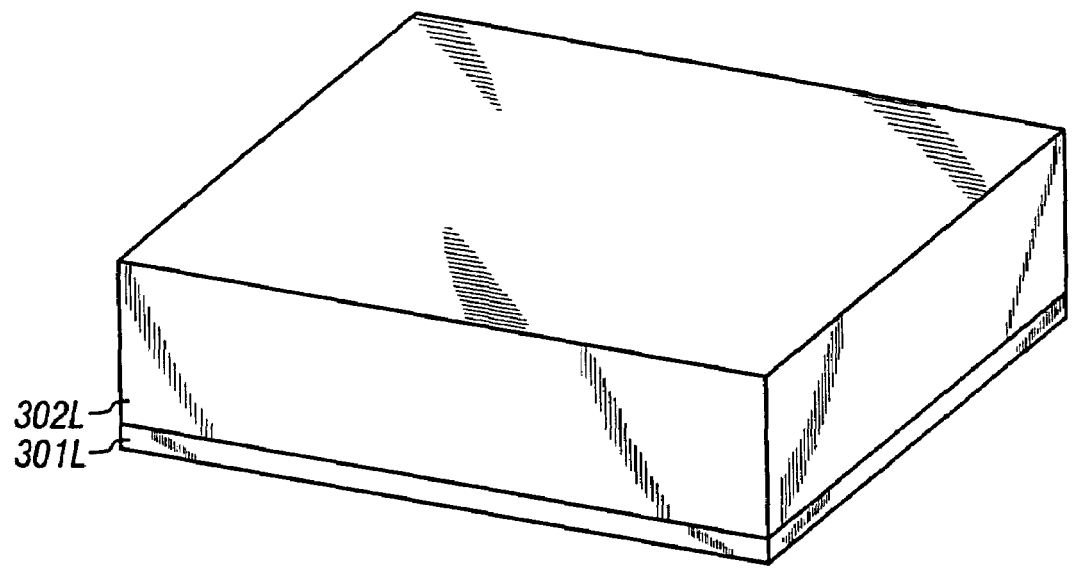
FIGS. 3A–3F illustrate the steps in fabricating a 3D memory cell.

One fabrication sequence for a 3D memory cell is schematically illustrated in FIGS. 3A–3F. After deposition and before patterning, a first conductor layer 301L and a first composite layer 302L are continuous sheets that extend across the entire integrated circuit (and across the entire wafer), as shown in FIG. 3A. A composite layer can comprise a plurality of layers used to form the pillars and, in one embodiment, can include any pillar compositions described in reference to FIGS. 2A–2D.

Figure 3B:
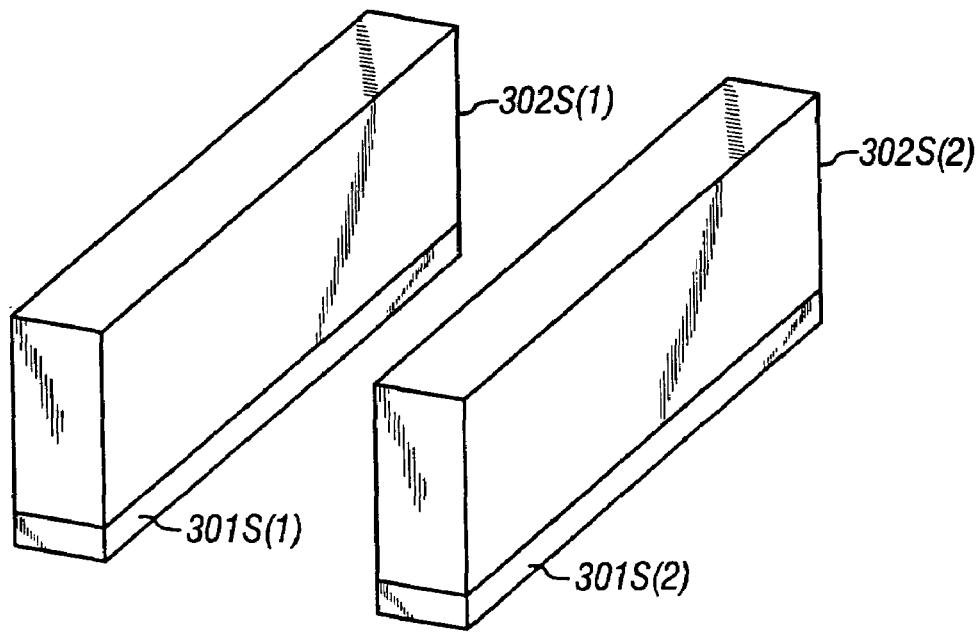

FIG. 3B illustrates the wafer after the patterning of first conductor layer 301L and first composite layer 302L, which forms first conductor strips 301S(1) and 301S(2) as well as first composite strips 302S(1) and 302S(2). Note that the edges of first composite strips 301S are aligned with the edges of first conductor strips 301S as both were etched at the same time with the same mask. A dielectric is then deposited on the wafer. While not shown in FIGS. 3A–3F, the dielectric fills the voids between the strips, thereby adding structural support to the memory array.

Figure 3C:
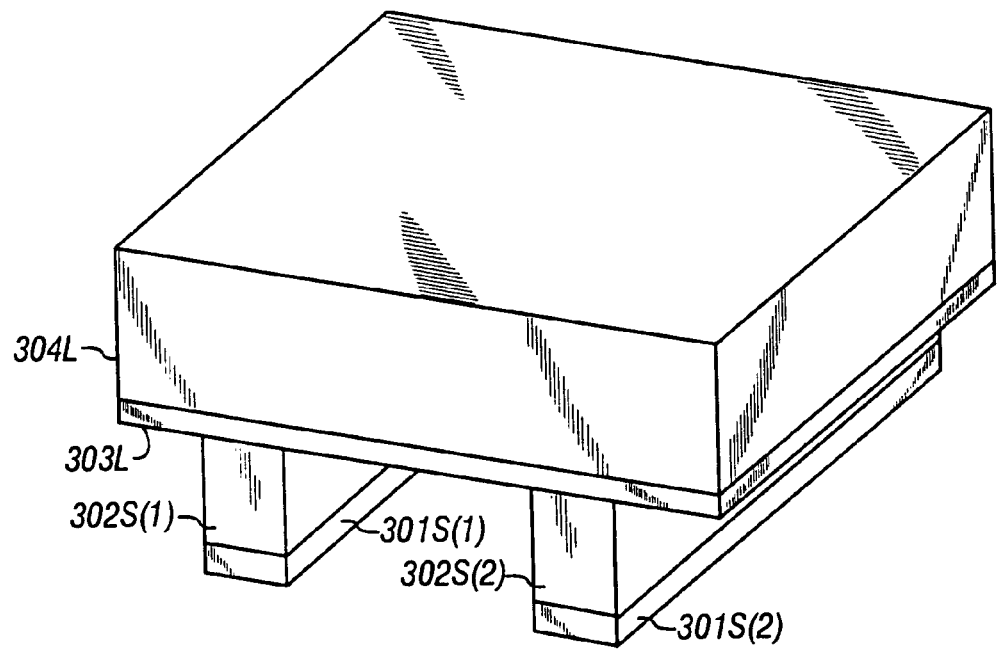

At this point, the wafer is planarized using CMP or other planarizing technology to reveal the upper surface of first composite strips 302S. Next, a second conductor layer 303L and a second composite layer 304L are sequentially deposited, as shown in FIG. 3C. Note that the previous planarization automatically gives a self-aligned contact between first composite strips 302S and second conductor layer 303L.

Figure 3D:
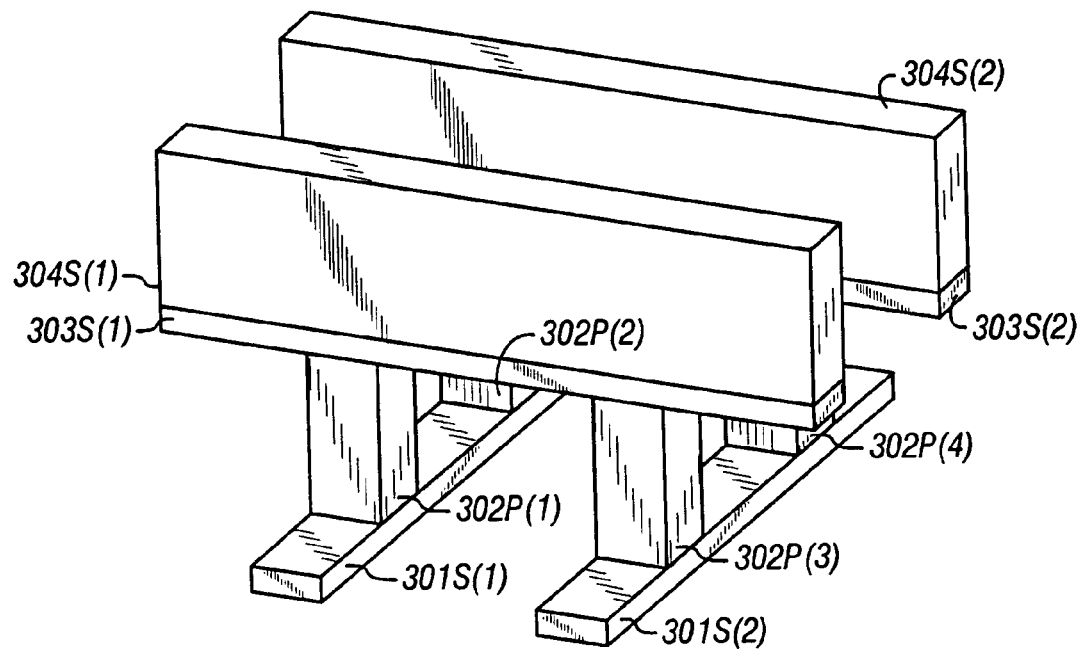
Figure 3E:
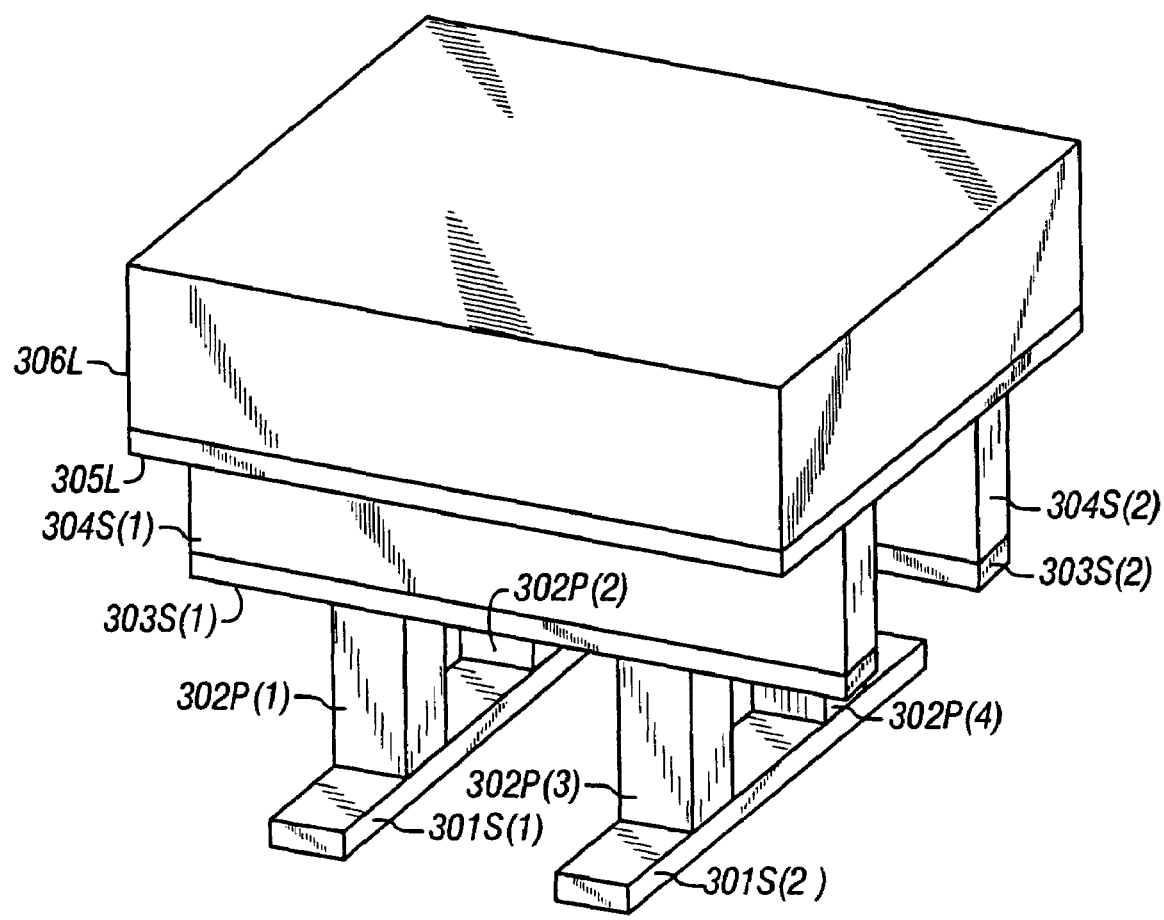

A second patterning operation can then be performed to etch second composite layer 304L, second conductor layer 303L, and first composite strips 302S. As shown in FIG. 3D, this second patterning operation forms first pillars 302P(1)–(4) (from first composite strips 302S(1)–(2)), second conductor strips 303S(1)–(2), and second composite strips 304S(1)–(2). Note that first pillars 302P are aligned to both first conductor strips 301S and second conductor strips 303S. Once again, a dielectric is deposited on the wafer and planarized to reveal second composite strips 304S. A third conductor layer 305L and a third composite layer 306L are then sequentially deposited, as shown in FIG. 3E.

Figure 3F:
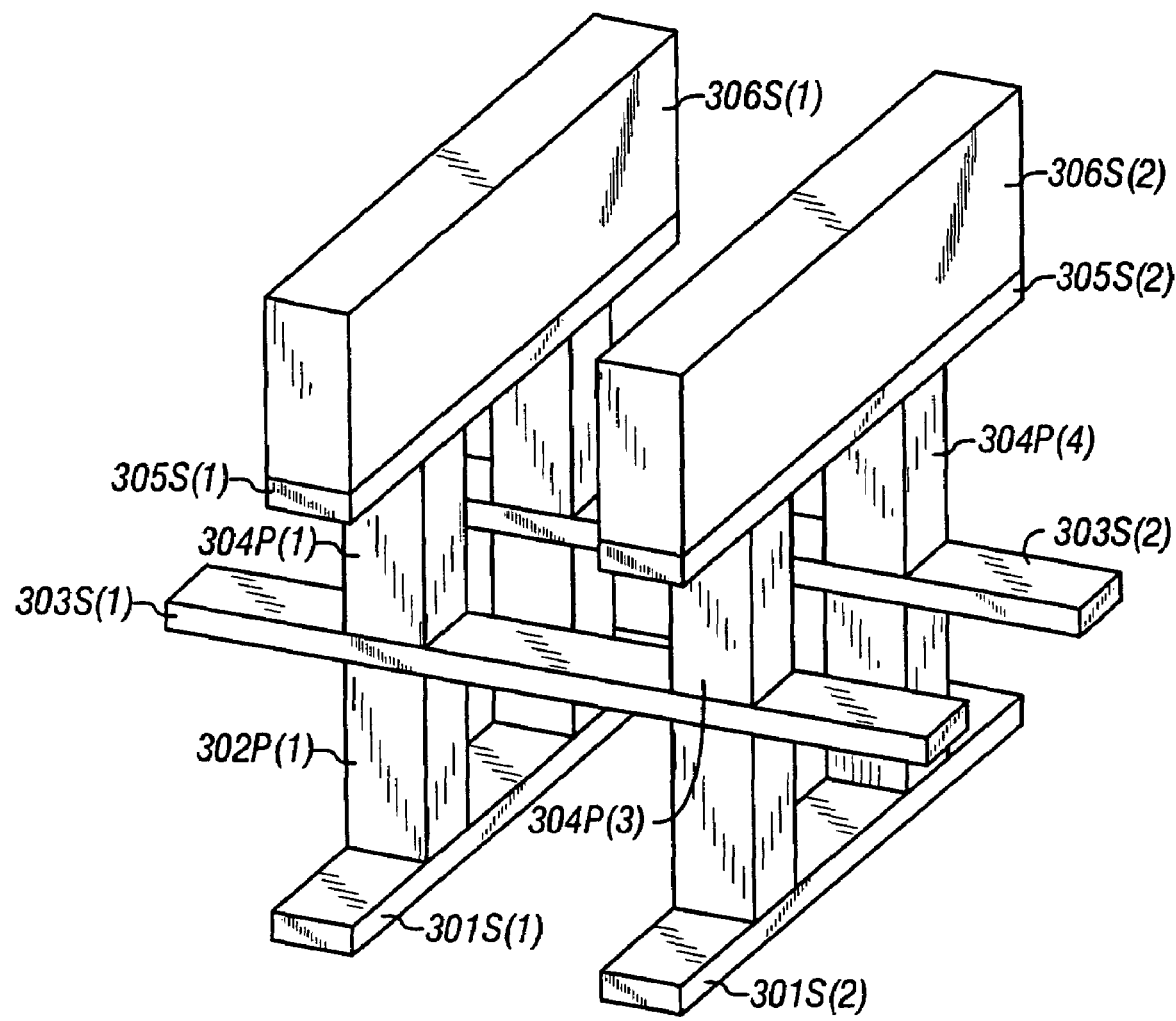

A third patterning operation can then be performed to etch third composite layer 306L, third conductor layer 305L, and second composite strips 304S. As shown in FIG. 3F, this third patterning operation forms second pillars 304P(1)–(4) (from second composite strips 304S(1)–(2)), third conductor strips 305S(1)–(2), and third composite strips 306S(1)–(2). Note that second pillars 304P are aligned to both second conductor strips 303S and third conductor strips 305S. Successive planes of memory cells can be formed in a similar manner.

Due to inherent physical characteristics in the etching process, the sidewalls of the composite strips can have some positive slope. Therefore, when dielectric is used to fill in the spaces between the composite strips before the composite strips are etched into pillars, the dielectric could overlie the sloped portion of the composite strips (stated another way, some of the silicon protruding outwardly from the side walls of the composite strips could become trapped under the dielectric that abuts the angled side wall).

In the region where the dielectric overlies the sloped portion of the composite strip, the dielectric could act as a hard mask in a subsequent unidirectional (anisotropic) vertical etch intended to further etch the composite strips (cross-wise) into pillars. A typical anisotropic etch can use a chemistry comprising HBr, $Cl_2$, and a polymerizing gas (such as $CHF_3$ or $C_2F_2H_2$). During this anisotropic etch, the dielectric overhang can shield two continuous thin wedges along the composite strips from being removed when the bulk of the composite strip is etched away for pillar formation. The result is that this dielectric overlying the sloped portions of the composite strips can protect the composite strips from being completely etched into electrically isolated pillars. Physically, the result after the pillar etch could look like pillars but with two very thin walls of residual composite material attaching adjacent pillars to each other along the direction of the original composite strip before the pillar etch. This residual material is referenced herein as "stringers". For the purpose of this description, "substantially free of stringers" means that neighboring pillars are electrically isolated such that they can be programmed independently of one another.

Figure 3G:
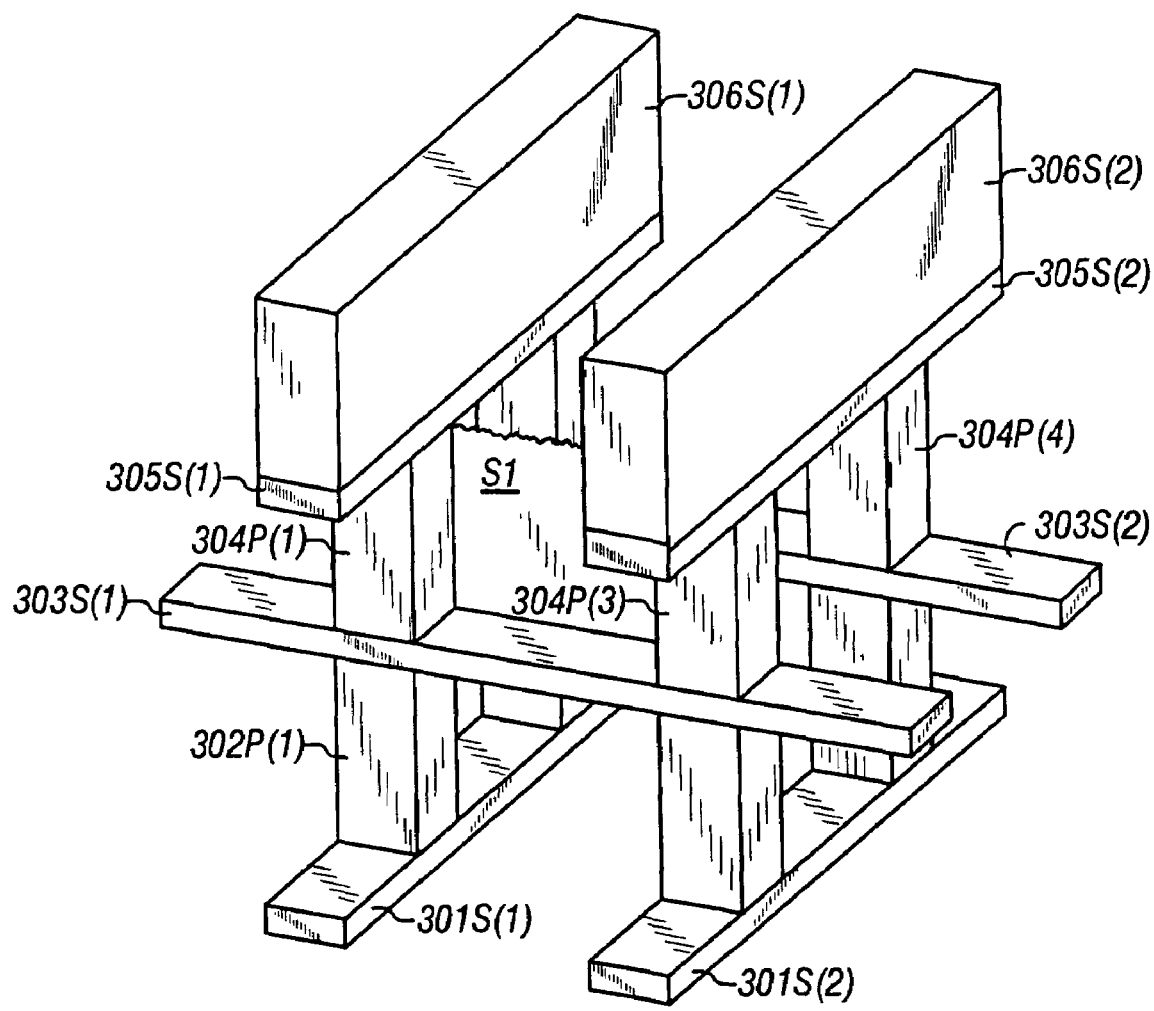
FIG. 3G illustrates a plurality of stringers that can be formed using the process described in reference to FIGS. 3A–3F.

FIG. 3G illustrates one such stringer S1 that attaches the back corners of pillars 304P(1) and 304P(3). Note that other stringers would also be formed connecting corners of adjacent pillars (e.g., connecting the front corners of pillars 304P(1) and 304P(3)), but are not shown in FIG. 3G to more clearly show stringer S1 and the pillar formations.

Figure 4A:
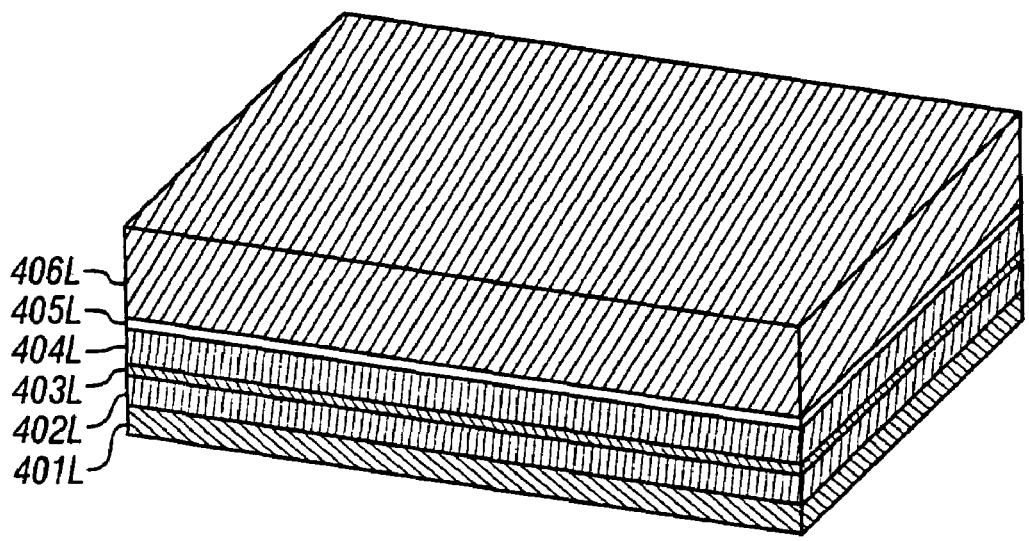
FIGS. 4A–4F illustrate the steps in fabricating a 3D memory cell using back-to-back patterning in accordance with one embodiment of the invention.
Figure 4B:
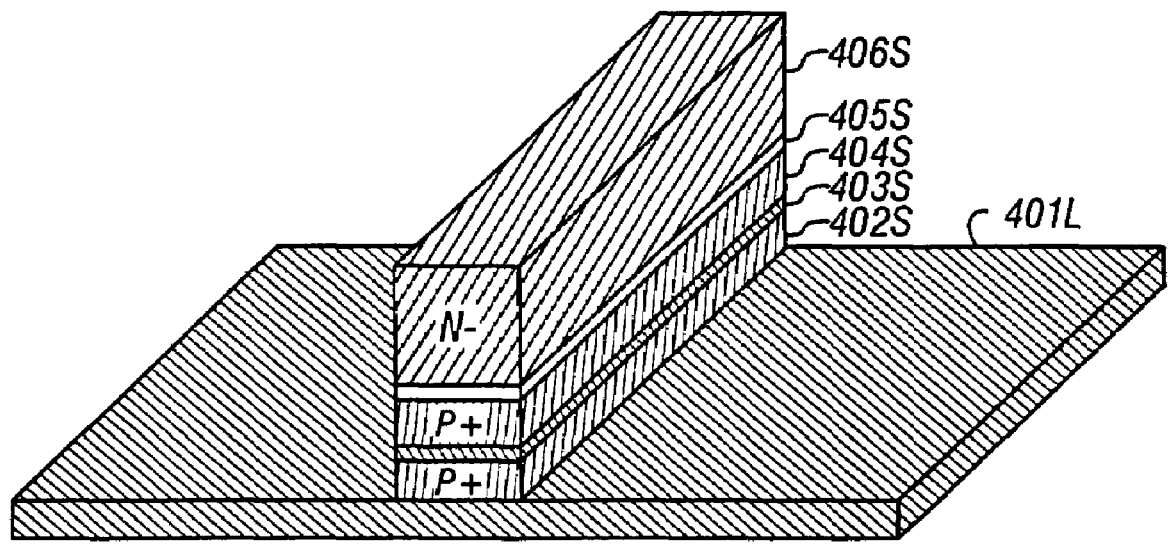

FIGS. 4A–4F illustrate one fabrication sequence to accurately implement electrically isolated pillars in silicon active devices. In one embodiment, the fabrication sequence may begin with a wafer that already includes devices or structures therein using standard processing steps. In one embodiment, an IMD oxide layer 401L (which serves as an insulator between the substrate and/or previously formed devices/structures) can be planarized. At this point, additional layers for forming one plane of active devices and conductors can be deposited as shown in FIG. 4A. In one embodiment, these additional layers can include a P+ silicon layer 402L, a conductive layer 403L, a P+ silicon layer 404L, an antifuse layer 405L, and an N– silicon layer 406L. Layers 402L–406L can then be patterned as strips in a first direction as shown in FIG. 4B, thereby creating a P+ silicon strip 402S, a conductive strip 403S, a P+ silicon strip 404S, an antifuse strip 405S, and an N– silicon strip 406S (wherein the plurality of strips can be called a rail). (Note that although only one rail is shown in FIG. 4B, a typical array would include multiple rails.)

Figure 4C:
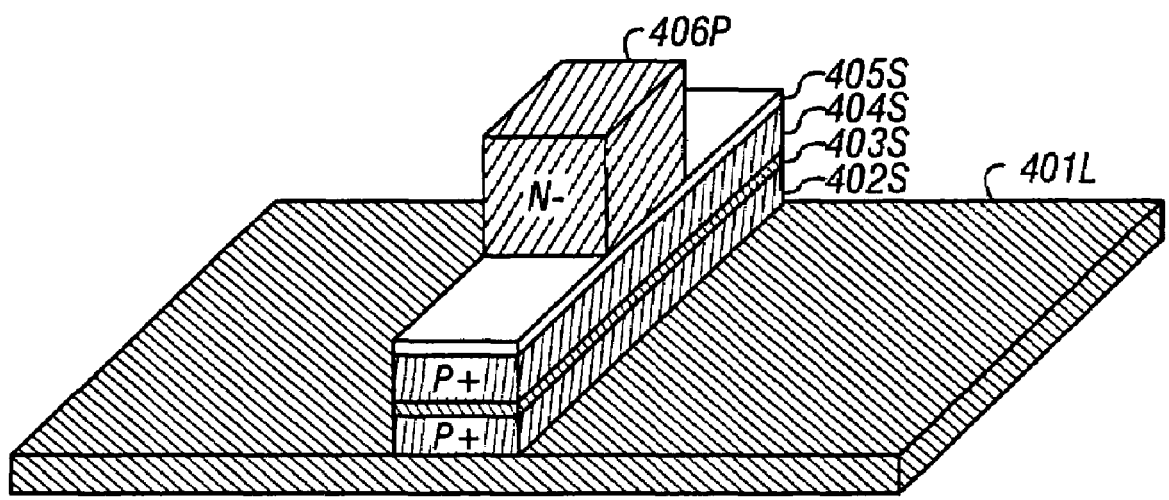

With no intervening steps that would add gap filling dielectric between such strips, a second patterning sequence can then be performed on N– silicon strip 406S to form N– silicon pillar 406P, i.e., one-half of the diode (the other half being P+ silicon strip 404S). This N− silicon pillar 406P is shown in FIG. 4C. Note that although gap filling dielectric is not deposited between patterning steps, other processing steps can be carried out, such as but not limited to sidewall oxidations, sidewall cleaning operations such as solvent dips, and anneals (such as furnace anneals or RTAs), without changing the "back-to-back" nature of the process described herein. Of importance, because gap filling dielectric is not deposited next to strips 402S–406S between the first and second patterning operations, the etching of N− pillar 406P forms no stringers, even assuming N− strip 406S exhibits a positive sidewall slope. In this manner, separation of active devices can be assured.

Note that the etching can end on antifuse strip 405S or at some point within antifuse strip 405S, since such antifuses often act as natural etch stops when using a silicon etchant, such as HBr+Cl$_2$ with an oxygen additive (e.g., O$_2$ or He/O$_2$). In other words, some portion of antifuse strip 405S remains following the second patterning operation. Although the pillar could be further etched to conductive strip 403S, the antifuse programming of this cell results in substantially the same diode area irrespective of whether antifuse strip 405S and P+ silicon strip 404S are etched to match N− pillar component 406P (although the electrical behavior of the cell could differ based on the etch depth).

At this point, a dielectric such as HDP-CVD SiO$_2$ or other material such as spin-on-glass (SOG) can be deposited to provide structural support for strips 402S–405S and pillar 406P. Dielectric is not shown to ensure that features of this isolated pillar architecture are not obscured. This dielectric can than be planarized to expose the upper surface of pillar 406P. Planarization can be performed using CMP, SOG etchback, or other similar methods. In one embodiment, an HF dip can be performed after planarizing the dielectric, thereby cleaning off any native oxide on the exposed surface of N− pillar 406P. In this manner, a large contact area is provided, which optimizes diode electrical performance.

Figure 4D:
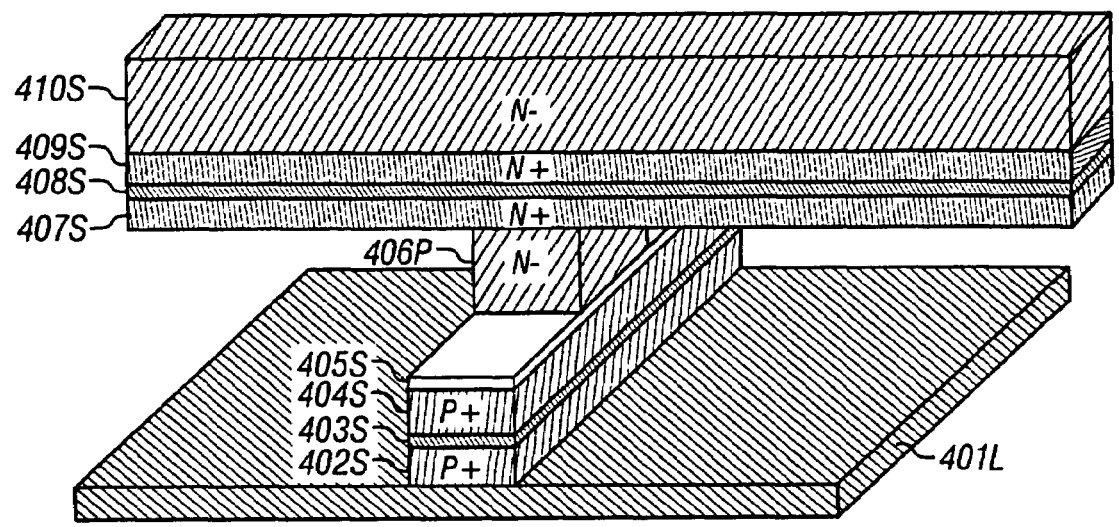

After exposing the upper surface of N− pillar 406P, another series of layers can be deposited and patterned into long straight strips running in a second direction (e.g., perpendicular to the first direction). FIG. 4D illustrates one exemplary set of strips including, for example, an N+ silicon strip 407S, a conductive strip 408S, an N+ silicon strip 409S, and an N− silicon strip 410S. Note that in one embodiment two different photolithographic masks can be used for forming N− silicon pillar 406P and strips 407S–410S, with strip patterns running in the same direction, but with distinct alignment marks, overlay registration structures, etc. In another embodiment, the same photolithographic mask used to form N− silicon pillar 406P can be used to form strips 407S–410S.

Figure 4E:
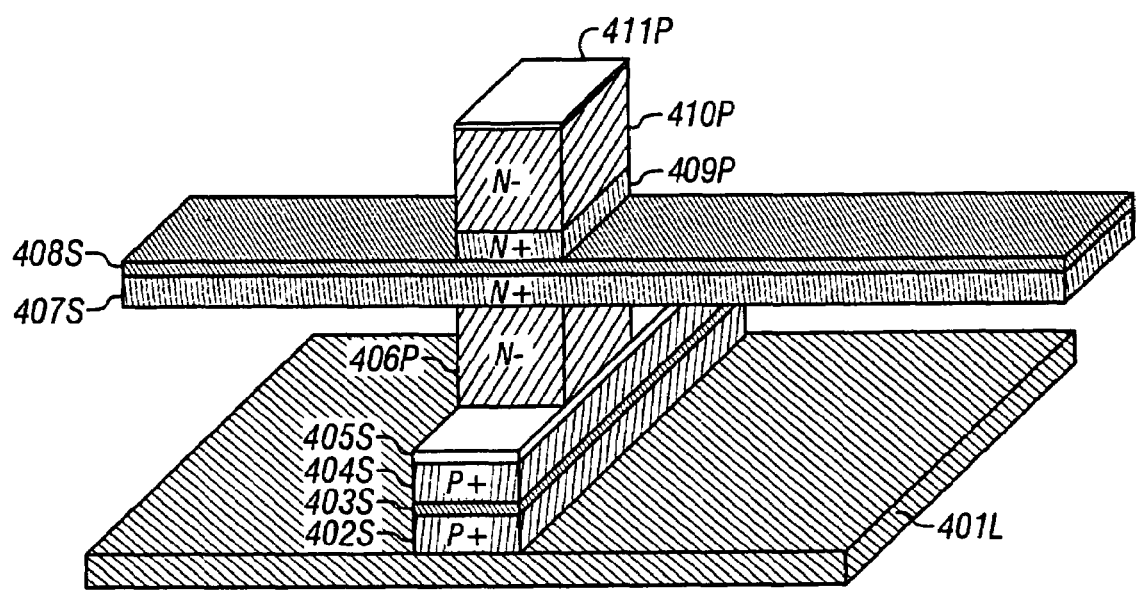

Once again, with no intervening steps that would substantially alter strips 407S–410S or add gap filling dielectric adjacent to such strips, another patterning sequence can then be performed on N− silicon strip 410S and N+ silicon strip 409S to form N− silicon pillar 410P and N+ silicon pillar 409P, wherein N− silicon pillar 410P forms one-half of a diode (the other half to-be-formed). Note that theoretically N+ silicon strip 409S could remain a strip. However, using current technology, it can be challenging to etch N− silicon pillar 410P and stop on N+ silicon strip 409S. N− silicon pillar component 410P and N+ silicon pillar component 409P are shown in FIG. 4E. Note once again that because back-to-back patterning of pillars 409P and 410P is performed, no stringers are formed, even assuming that strips 409S and 410S exhibit a positive sidewall slope. In this manner, separation of active devices in this plane can also be assured.

At this point, a dielectric can be deposited to provide structural support for strips 407S–408S and pillars 409P and 410P. After planarization of this dielectric, which exposes a top surface of N− silicon pillar 410P, (and, in one embodiment, after an HF dip to remove native oxide) an antifuse layer can be grown on N− silicon pillar 410P to form an antifuse pillar 411P (also shown in FIG. 4E). In other embodiments, an antifuse layer can be deposited in combination with the subsequent layers described below.

Figure 4F:
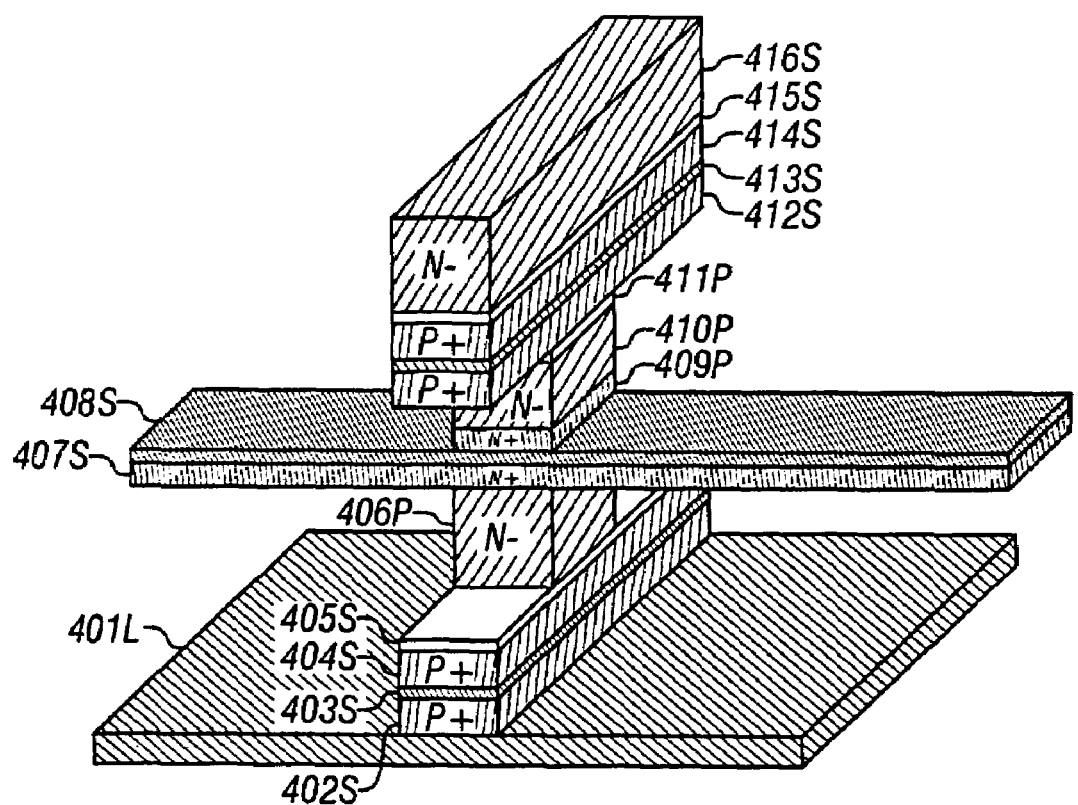

Then, another series of layers can be deposited and patterned into long straight strips running in the first direction. FIG. 4F illustrates one exemplary set of strips including, for example, a P+ silicon strip 412S (which forms the other half of the diode including N− silicon pillar 410P), a conductive strip 413S, a P+ silicon strip 414S, an antifuse strip 415S, and an N− silicon strip 416S. Note that the previously-described patterning steps used on strips 402S–406S can now be used on strips 412S–416S to form an N− silicon pillar from N− silicon strip 416S. At this point, two complete active devices having both input and output terminals have been fabricated. Additional planes can be formed using similar steps.

Fabricating the isolated pillar architecture of the invention can be performed with various dopant concentrations for the silicon, etchants, materials, layer thicknesses, and processing conditions. Exemplary materials, values, and/or ranges are herein described for illustrating one embodiment. Other materials, values, and/or ranges can be used in other embodiments to provide different operating results. Note that values and ranges described herein are approximate only and may vary depending on the processes used and/or the desired functionality.

The silicon used in the cells and in the conductors may be doped in situ or after being deposited, for example, by ion implantation. In accordance with one embodiment of the invention, the N− silicon (e.g., used to form N− silicon pillars 406P and 410P as well as N− silicon strip 416S) can be doped at a concentration less than $5 \times 10^{17}$ atoms/cm$^3$. Performance of the cell can be enhanced by doping the N− silicon at a concentration less than $1 \times 10^{17}$ atoms/cm$^3$ or, preferably, even less than $1 \times 10^{16}$ atoms/cm$^3$. In fact, the silicon can even be undoped (i.e., no intentional doping is performed) as long as the silicon is not electrically P-type. The N+ silicon (e.g., used to form N+ silicon strip 407S and N+ silicon pillar 409P) can be doped at a concentration greater than $5 \times 10^{18}$ atoms/cm$^3$. Performance of the cell can be enhanced by doping the N+ silicon at a concentration more than $1 \times 10^{19}$ atoms/cm$^3$ or preferably even more than $1 \times 10^{20}$ atoms/cm$^3$.

Note that adjacent N+ and N− silicon (e.g., N+ silicon pillar 409P and N− silicon pillar 410P) can be formed by various methods. For example, the N+ and N− silicon can be formed with one deposition that uses ion implantation steps at two different energy and dosage levels to obtain the two doping levels. In another embodiment, the N+ and N− silicon can be formed by introducing different amounts of dopant (e.g., in a diffusion process) as each layer is formed.

The P+ silicon (e.g., P+ silicon strips 402S, 404S, 412S, and 414S) can be doped at a concentration greater than $5 \times 10^{18}$ atoms/cm$^3$. Performance of the cell can be enhanced by doping the P+ silicon at a concentration more than $1 \times 10^{19}$ atoms/cm$^3$ or even more than $1 \times 10^{20}$ atoms/cm$^3$.

Feed gases for silicon etching include, but are not limited to, Cl$_2$, HBr, He, O$_2$, CF$_4$, N$_2$, or alternate carbon-containing gases such as $C_2F_6$. Note that the feed gas can be selected based on both the etched materials as well as the etch stop materials involved in that process step.

Deposited antifuse material (e.g., antifuse strip 405S) can be formed from silicon dioxide using $SiH_4$ and $O_2$ (or other oxygen containing gases, such as $N_2O$). This antifuse material can be deposited using a plasma system or in a system where reactive molecules are created thermally. Thermal systems can include, for example, high temperature oxide (HTO) deposition furnaces. Grown antifuse material (e.g., antifuse pillar 411P) can be formed using rapid thermal oxidation (RTO), furnace oxidation (with or without steam), or high-density plasma (HDP) oxidation among other techniques. Other grown or deposited materials can be used for the antifuse material, such as silicon oxynitride, nitrided oxides, HDP plasma-grown (mentioned above) oxynitrides, oxycarbides, and other materials.

In one embodiment, each conductive layer (e.g., used to form conductive strips 403S, 408S, and 413S) can include a first layer of Ti and a second layer of TiN. The first layer of Ti, which can have a thickness between 100 Å and 1000 Å (and preferably between 250 Å and 500 Å), is deposited on the P+ silicon layer. The second layer of TiN, which can have a thickness between 50 Å and 250 Å (and preferably between 100 Å and 150 Å), is deposited on the first Ti layer.

The thickness for the P+ silicon layers (e.g., used to form P+ silicon strips 402S and 412S) adjacent the Ti layers can be between 500 Å and 3000 Å, and preferably between 1000 Å and 2000 Å. These P+ silicon layers can be very thin because their principal function is to facilitate the formation of $TiSi_2$, which forms part of the interconnect of the isolated pillar architecture. The thickness for the P+ silicon layers (e.g., used to form P+ silicon strips 404S and 414S) adjacent the TiN layers can be between 200 Å and 3000 Å, and preferably between 250 Å and 750 Å.

The thickness for the N+ silicon layer (e.g., used to form N+ silicon strip 407S) adjacent the Ti layer can be between 500 Å and 3000 Å, and preferably between 1000 Å and 2000 Å. The thickness for the N+ silicon layer (e.g., used to form N+ silicon pillar 409P) adjacent the TiN layer can be between 200 Å and 3000 Å, and preferably between 200 Å and 500 Å. The thickness for the N− silicon layers (e.g., used to form N− silicon pillars 406P and 410P as well as N− strip 416S) can be between 2000 Å and 5000 Å, and preferably between 3000 Å and 4500 Å (wherein after planarization, the thickness for these N− silicon layers can be between 1500 Å and 2000 Å, and preferably between 2000 Å and 4500 Å). Finally, the thickness of the antifuse material (e.g., used to form antifuse strips 405S and 415S as well as antifuse pillar 411P) can be between 15 Å and 40 Å, and preferably between 20 Å and 30 Å, for the case of an RTO grown SiO2 antifuse.

Processing conditions vary from one layer to another. For example, the Ti layer can be obtained using a sputtering process including conventional plasma vapor deposition (PVD) or ionized metal plasma PVD (IMP-PVD). Alternatively, the Ti layer can be obtained using chemical vapor deposition (CVD). The TiN layer can be reactively sputtered, wherein Ti is the target material in a $N_2$ ambient. Alternatively, the TiN layer can be obtained by using rapid thermal nitridation of Ti, or CVD. The N-type silicon can be obtained by reacting silane ($SiH_4$) with phosphine dopant gas at a temperature of approximately 550° C. and a pressure of 400 mTorr. Note that in one embodiment, the gas can be in an inert diluent, such as He or $N_2$. The P-type silicon can be obtained by reacting silane ($SiH_4$) with $BCl_3$ dopant gas at a temperature of approximately 550° C. and a pressure of 400 mTorr. Once again, although not a necessity, the gas can be in an inert diluent, such as He or $N_2$. The antifuse layer can be grown by rapid thermal oxidation (RTO) at a temperature of between 700° C. and 800° C. for 30–120 seconds. Alternatively, the antifuse layer can also be grown using a high-density plasma (HDP) process including $O_2$ for 2–30 seconds. In yet another embodiment, the antifuse layer can be obtained by using furnace oxidation including steam at 600° C. for 30 minutes.

FIGS. 5A–5F illustrate cross-sectional views of the isolated pillar architecture of the invention when forming an inter-memory connection, hereinafter called a zia. For convenience, the reference numerals used in describing the isolated pillar architecture of FIGS. 4A–4E are also used in FIGS. 5A–5F and refer to similar materials.

Figure 5A:
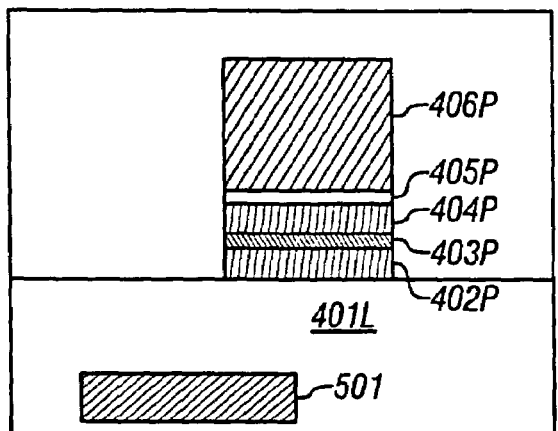
FIGS. 5A–5F illustrate the steps in fabricating a zia in the 3D memory cell of the invention.
Figure 5B:
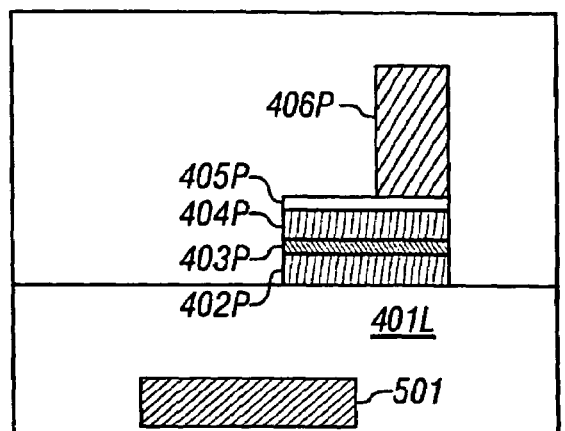
Figure 5C:
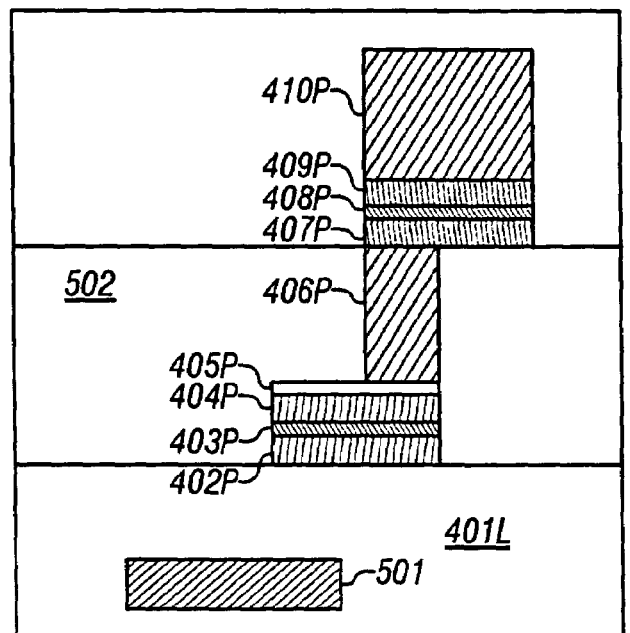
Figure 5D:
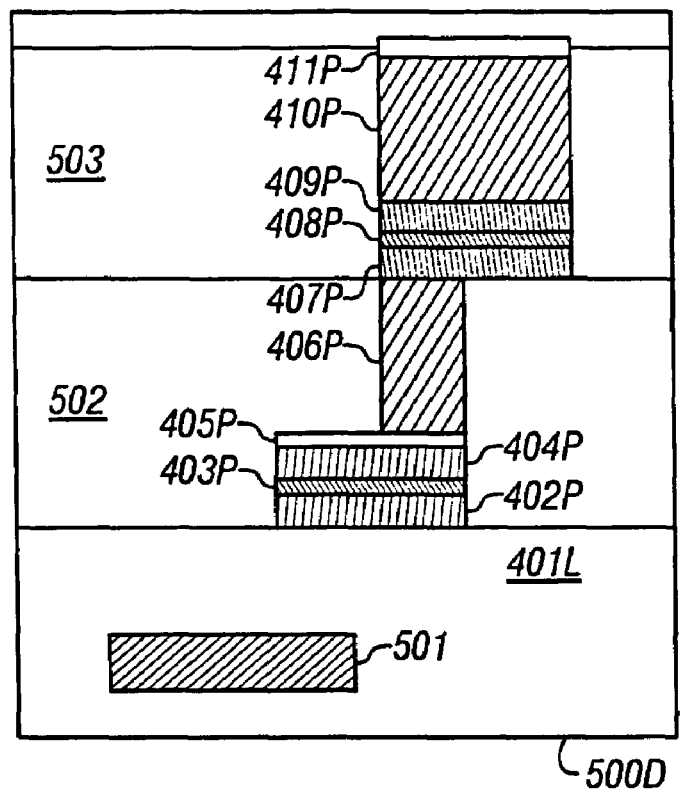

FIG. 5A illustrates, in a cross-sectional view 500A, that a plurality of pads 402p–406p (wherein the materials for these pads are as follows: 402p includes P+ silicon, 403p includes conductive material, 404p includes P+ silicon, 405p includes antifuse material, and 406 includes N− silicon) are formed on oxide layer 401L and are positioned to overlap a conductive structure 501 formed in oxide layer 401L. Conductive structure 501 could include, for example, a refractory metal, a refractory metal silicide, a combination of these two materials, or any other material/combination of materials that can withstand memory-level processing temperatures. Note that the patterning of pads 402P through 406P can coincide with the step used to form strips 402S through 406S shown in FIG. 4B. FIG. 5B illustrates, in a cross-sectional view 500B, an etching of N− silicon pad 406p to expose a surface (or portion) of antifuse pad 404p. This step corresponds to the patterning step shown in FIG. 4C. FIG. 5C illustrates, in a cross-sectional view 500C, pads 407p–410p (wherein the materials for these pads are as follows: 407p includes N+ silicon, 408p includes conductive material, 409p includes N+ silicon, and 410p includes N− silicon) being formed on etched N− silicon pad 406p and a dielectric 502. Pads 407p–410p can be positioned to overlap pads 402p–404p by an amount substantially equal to the width of etched N− silicon pad 406p (subject to the alignment tolerance of the photolithography tool). During the step in which N− pillar component 410P is typically formed (see FIG. 4E), the zia area can be covered with photoresist, thereby ensuring that pads 407p–410p remain unetched. FIG. 5D illustrates, in a cross-sectional view 500D, that after deposition and planarization of dielectric 503 an antifuse pad 411p can be grown on N− silicon pad 410p.

Figure 5E:
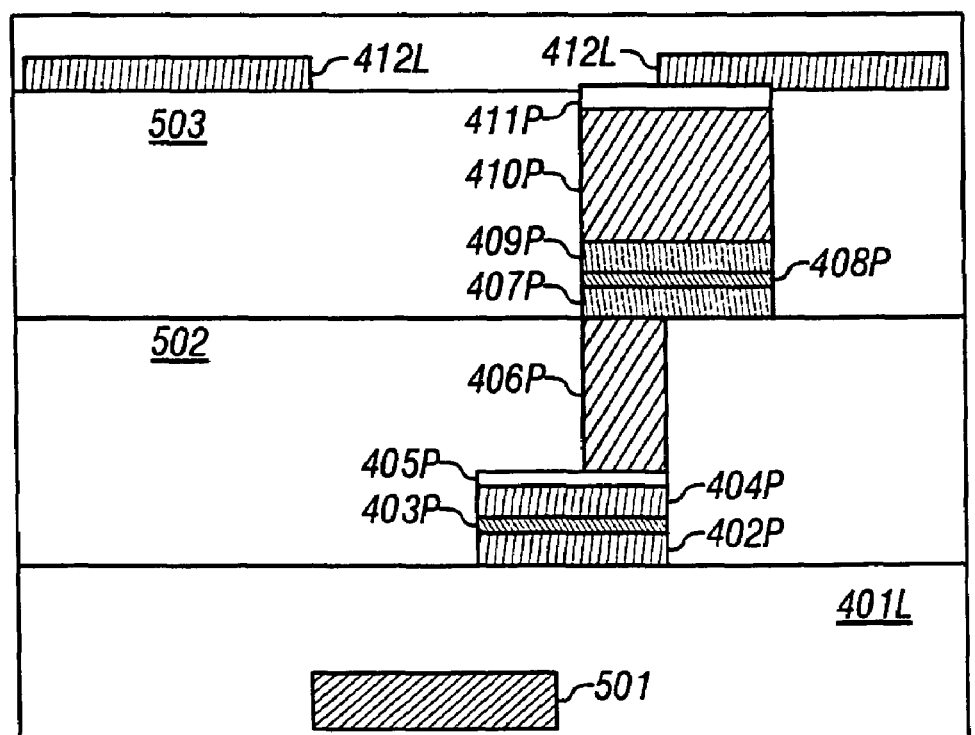
Figure 5F:
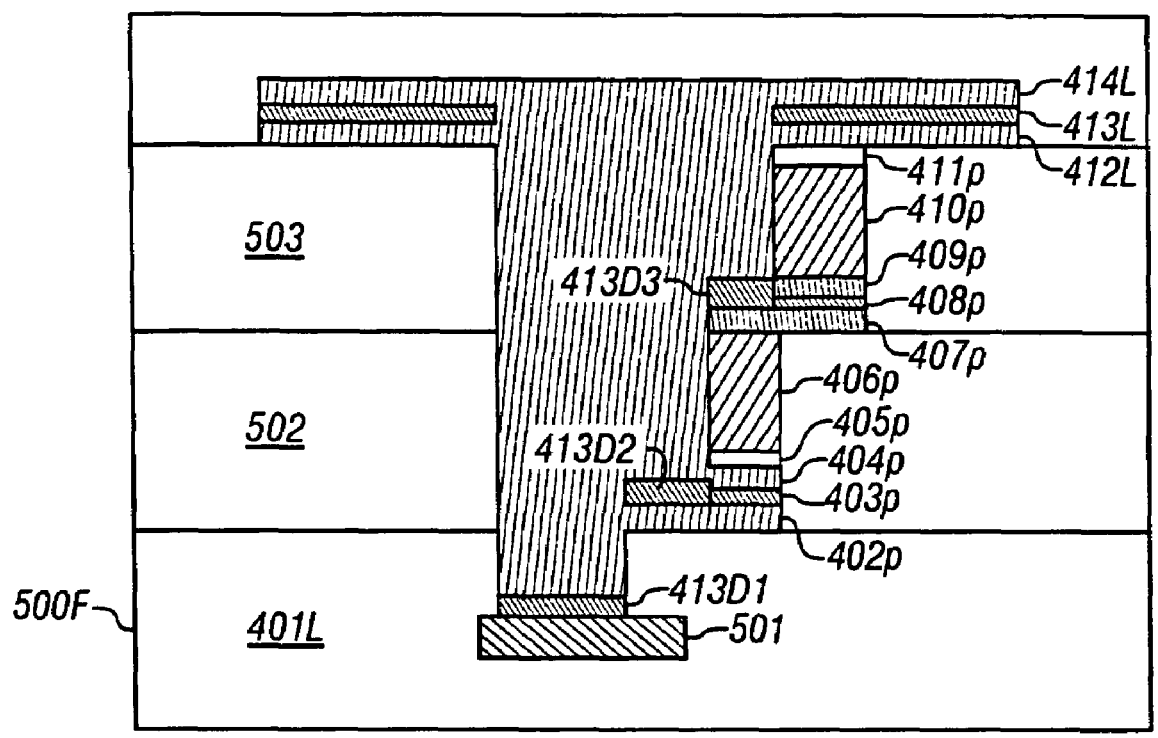

FIG. 5E illustrates, in a cross-sectional view 500E, the formation and etching of P+ silicon layer 412L to form an opening that overlaps conductive structure 501 and pads 407p–411p. Etched P+ silicon layer 412L can serve as a hardmask (i.e., a mask using a material other than photoresist) during subsequent etches to form the zia. Specifically, an oxide etch can be performed to stop on N− silicon pad 410p (etching through dielectrics 503, 502, and antifuse pad 411p), P+ silicon pad 404p (etching through antifuse pad 405p), and conductive structure 501 (etching through dielectrics 503, 502 as well as oxide layer 401L). Then, a silicon etch can be performed to etch through N− silicon pad 410p, N+ silicon pad 409p, and P+ silicon pad 404p, thereby exposing a portion of conductive pad 408p as well as conductive pad 403p. FIG. 5F illustrates, in a cross-sectional view 500F, the result of this three-step etch, wherein the subsequent deposition of conductive layer 413L actually deposits on the "steps" of the various memory cell planes, thereby acting as the "glue layer" of the zia. Deposited structures 413D1 (formed on conductive structure 501), 413D2 (formed on conductive pad 403p), and 413D3 (formed on conductive pad 408p) are shown in FIG. 5F. At this point, the zia can be filled with P+ silicon as provided during the deposition of P+ silicon layer 414L.

Although illustrative embodiments of the invention have been described in detail herein with reference to the accompanying figures, it is to be understood that the invention is not limited to those precise embodiments. They are not intended to be exhaustive or to limit the invention to the precise forms disclosed. As such, many modifications and variations will be apparent to practitioners skilled in this art.

For example, the above-described back-to-back patterning is applicable not only to diodes, but other active devices. As used herein, the term "active device" can be defined as any device that has asymmetric current versus voltage characteristics. Examples of active devices include diodes and transistors. An active device is contrasted with a passive device, which does not control voltage or current. Examples of passive devices include resistors, capacitors, and inductors.

Figure 4G:
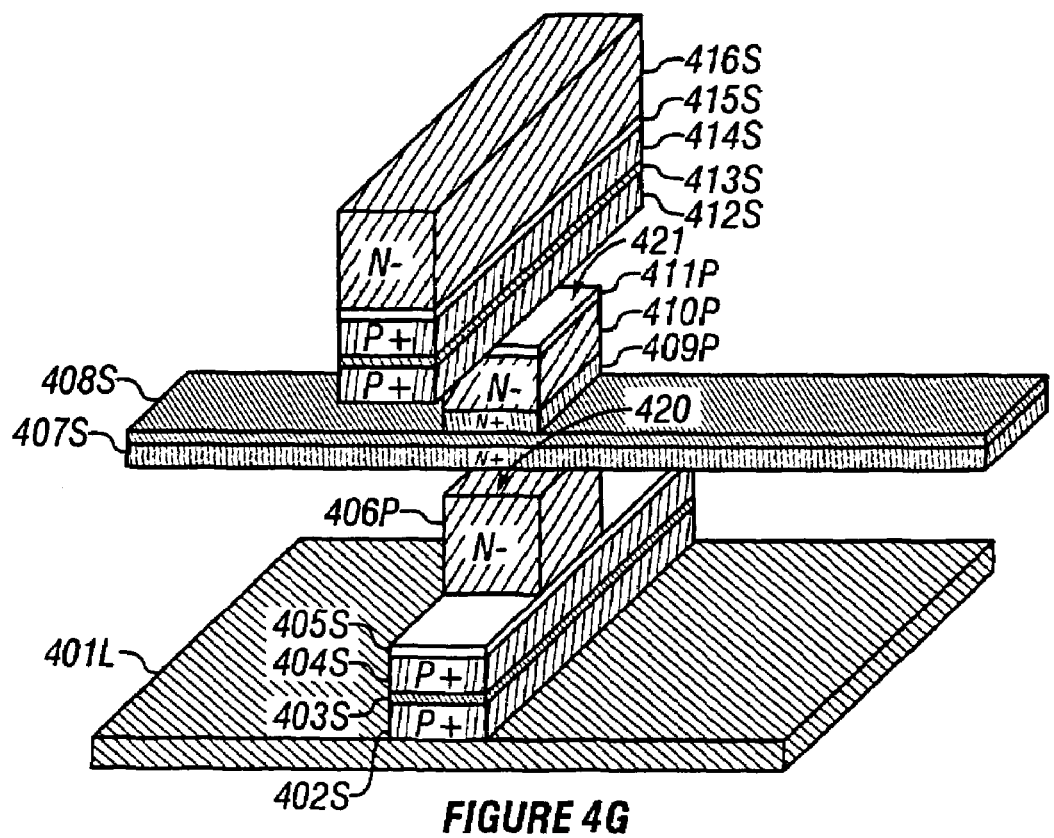
FIG. 4G illustrates two areas that demonstrate a non-self alignment aspect of the isolated pillar architecture.
Figure 4H:
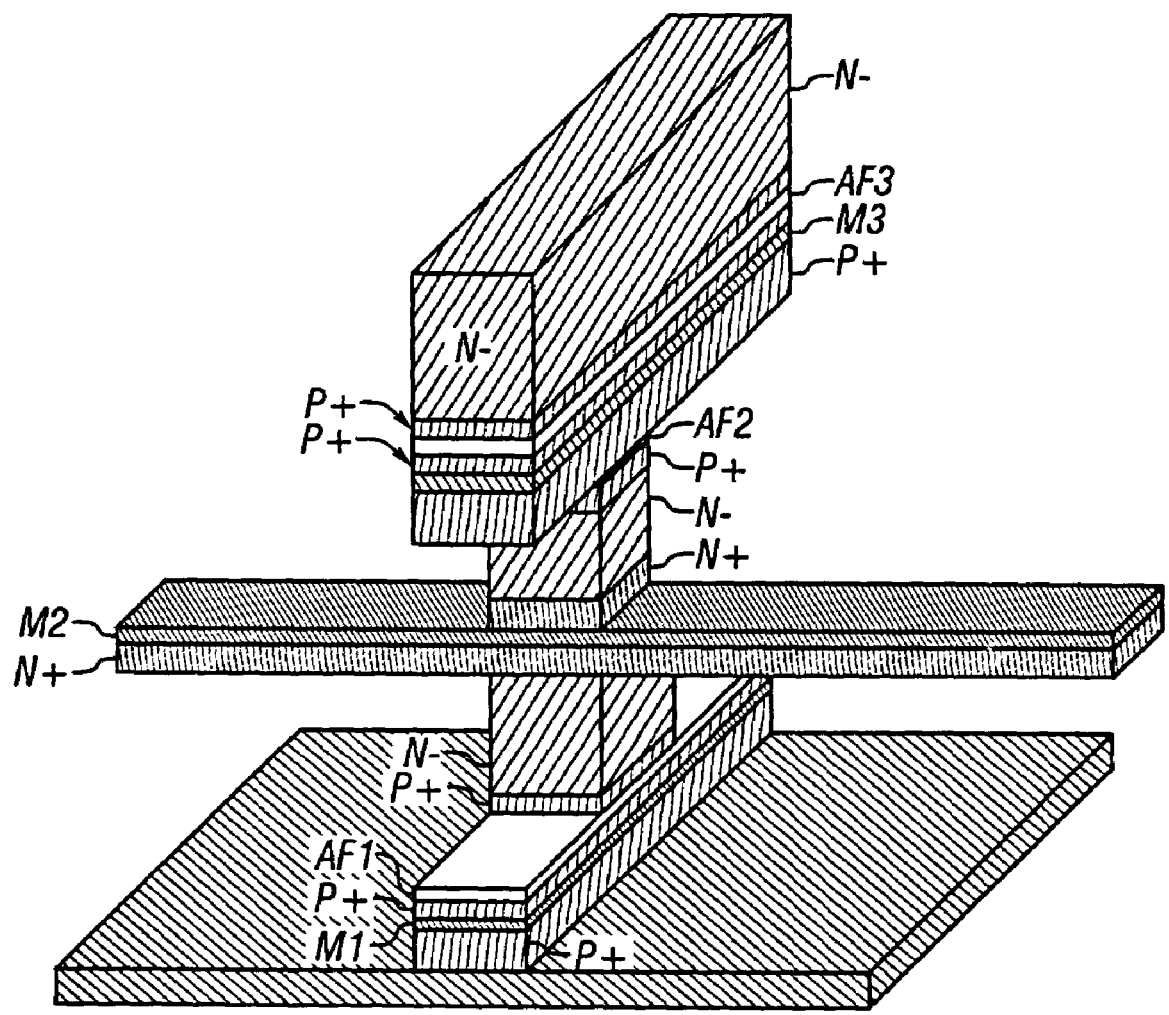
FIG. 4H illustrates one embodiment of the isolated pillar architecture in which an antifuse is formed adjacent to a diode.

Of importance, although FIGS. 4A–4F illustrate the formation of an incipient diode (i.e., an antifuse formed between its anode and cathode), other embodiments of the isolated pillar architecture can include an antifuse formed adjacent to the diode. For example, FIG. 4H illustrates one embodiment in which an antifuse is formed adjacent to a diode, thereby enhancing the forward current of the programmed diode/antifuse device. For ease of reference, layers are labeled by silicon type (P+, N−, and N+), metal location (M1 and M2), and antifuse location (AF1, AF2, and AF3).

In the embodiment shown in FIG. 4H, each of the antifuse layers AF1, AF2, and AF3 are formed between two P+ layers, as described in further detail below. In this embodiment, a first terminal for a first device can be formed by the P+ and the M1 strips formed on the substrate. The state change element of the first device can include the AF1 strip sandwiched between the two P+ strips and formed on the M1 strip. The diode of the first device can include the P+ ($3^{rd}$) strip and the N− pillar formed on the AF1 strip. The second terminal for the first device can include the N+ and the M2 strips formed on the N− pillar.

In a similar manner, a first terminal for a second device can include the M2 strip and the N+ pillar formed on the M2 strip. The diode of the second device can include the N− and P+ pillars formed on the first terminal for the second device. The state change element of the second device can include the AF2 pillar sandwiched between the P+ pillar and the P+ strip. The second terminal of the second device can include the M3 strip and the P+ strip formed on the M3 strip. Additional planes of devices can be formed from the remaining AF3, P+, and N− strips shown in FIG. 4H.

In accordance with one feature of the invention, the material composition and processing techniques used to form the structure in FIG. 4H can be substantially identical (exceptions explained in further detail below) to the material composition and processing techniques used to form the structure in FIG. 4F. For example, strips P+/M1/P+/AF1/P+/N− can be patterned in a first direction, wherein strips N+/M2/N+/N−/P+ can be patterned in a second direction, thereby forming the P+/N− and the N+/N−/P+ pillars. Strips P+/M3/P+/AF3/P+/N− can also be patterned in the first direction. Of importance, gap filling dielectric is not added until after the formation of the pillars in FIG. 4H, thereby ensuring that stringers are not formed. In this manner, separation of active devices can be assured. Note that after the gap filling dielectric is deposited, it can be planarized to expose the surface of the underlying pillar. Planarization can be performed using CMP, SOG etchback, or other similar methods.

Note that the P+ structures (i.e., the strips/pillars) that contact each of AF1–AF3 can be formed from identical materials using substantially identical processing techniques to those described for FIGS. 4A–4G. In one embodiment, the thickness of such P+ structures can also be identical, thereby increasing the height of the resulting device. In another embodiment, the thickness of the N− pillar can be decreased (e.g., on the order of 200 Å) to minimize (or even eliminate) any increase in the height of the resulting device. For example, in FIG. 4H, the thickness of the upper N− pillar appears to be decreased relative to the upper N− pillar. Note that changes in any thicknesses can result in functional variations and therefore should be closely analyzed.

Although FIGS. 4A–4F illustrate specific planes of active devices being formed using certain materials, these figures are exemplary only. For example, the first plane of active devices could be formed using strips 407S–410S (i.e., eliminating layers 402L–406L).

Additionally, the isolated pillar architecture of the invention has applicability to active devices that are not necessarily part of memory arrays. Specifically, the pillar-forming process described in reference to FIGS. 4A–4F can be used whenever one is building active devices that require pillars that do not electrically interfere with each other. For example, the isolated pillar architecture can be used to form arrays of thin film transistors (TFTs) that need electrical isolation in order to avoid disturb phenomena, other varieties of antifuse-programmable diode memory, and other kinds of memory and logic devices.

Figure 5G:
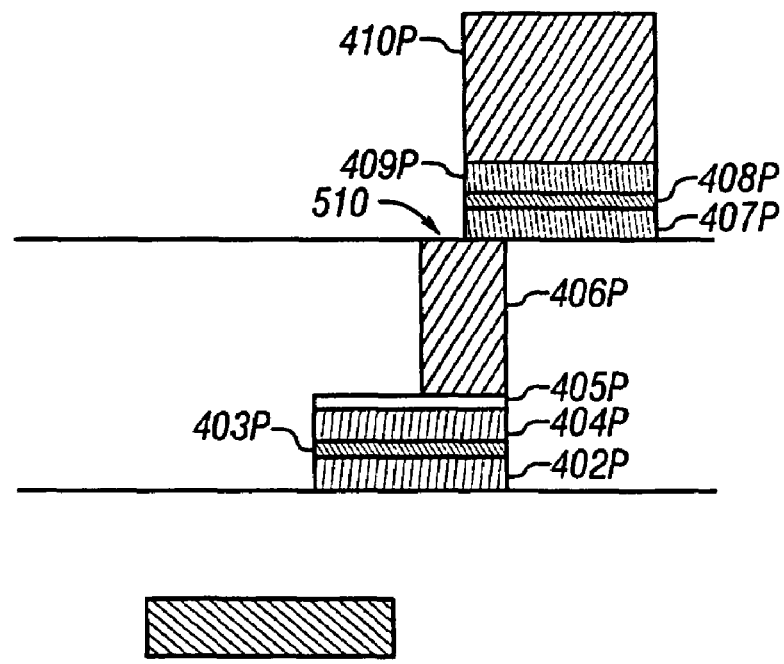
FIG. 5G illustrates an area in the zia that demonstrates another non-self alignment aspect of the isolated pillar architecture.

Note that the strips and pillars of the isolated pillar architecture are non-self aligned (wherein, in general, pillars can be self-aligned to the strips below, but not self-aligned to the strips above). FIG. 4G illustrates two areas 420 and 421 that demonstrate this non-self alignment aspect of the architecture. In accordance with one feature of the invention, although the strips should still substantially overlap the pillars for proper functioning, the actual alignment can be subject to the capabilities of the photolithography tool. This non-self alignment can also present itself during formation of a zia, as indicated by area 510 in FIG. 5G. Identical reference numerals refer to identical elements. Therefore, the structures in FIGS. 4G and 5G can be formed using the same steps and materials described for FIGS. 4A–4F and 5A–5F, respectively.

Finally, although fabricating the isolated pillar architecture can include etching processes that form strips, other structures can also be formed. In other words, the etches could form non-linear structures, wherein pillars can be formed at the intersection of such non-linear structures.

Accordingly, it is intended that the scope of the invention only be defined by the following Claims and their equivalents.

The invention claimed is:

1. A monolithic 3-dimensional memory array comprising:
a first plane of memory cells;
a first set of strips including a first terminal;
a second set of strips including a second terminal;
a third set of strips including a third terminal;
a plurality of first pillars, each first pillar having at least one side wall with a slightly positive slope, each first pillar disposed between and connecting one of said first strips and one of said second strips, and including a first P doped silicon region, a first N doped silicon region and a first insulating region;

a second plane of memory cells;
a plurality of second pillars, each second pillar having at least one side wall with a slightly positive slope, each second pillar disposed between and connecting one of said second strips and one of said third strips, and including a second P doped silicon region, a second N doped silicon region and a second insulating region;
wherein each of the pluralities of first and second pillars is substantially free of stringers, and
wherein the first plane of memory cells includes the first pillars, the second plane of memory cells includes the second pillars, and first and second pillars included in memory cells in the first plane and the second plane of are free of stringers.

2. The memory of claim 1, wherein each of said first and second insulating regions is disposed between the respective P and N doped silicon regions.

3. The memory of claim 1, wherein the respective P and N doped silicon regions abut one another.

* * * * *